United States Patent
Yamamoto et al.

(10) Patent No.: US 10,916,421 B2
(45) Date of Patent: Feb. 9, 2021

(54) METHOD OF MANUFACTURING EPITAXIAL SILICON WAFERS

(71) Applicant: GLOBALWAFERS JAPAN CO., LTD., Niigata (JP)

(72) Inventors: Jun Yamamoto, Niigata (JP); Shinya Matsuda, Niigata (JP)

(73) Assignee: GLOBALWAFERS JAPAN CO., LTD., Niigata (JP)

(*) Notice: Subject to any disclaimer, the term of this patent is extended or adjusted under 35 U.S.C. 154(b) by 42 days.

(21) Appl. No.: 16/408,825

(22) Filed: May 10, 2019

(65) Prior Publication Data
US 2019/0393032 A1 Dec. 26, 2019

(30) Foreign Application Priority Data
Jun. 25, 2018 (JP) .................. 2018-119767

(51) Int. Cl.
*C30B 25/16* (2006.01)
*H01L 21/02* (2006.01)
*H01L 21/687* (2006.01)

(52) U.S. Cl.
CPC .... *H01L 21/02381* (2013.01); *H01L 21/0262* (2013.01); *H01L 21/68714* (2013.01)

(58) Field of Classification Search
CPC ......... C30B 25/02; C30B 25/08; C30B 25/16; C30B 25/165
See application file for complete search history.

(56) References Cited

U.S. PATENT DOCUMENTS

| | | | | |
|---|---|---|---|---|
| 2003/0041799 A1* | 3/2003 | Yang | ........................ | C30B 25/12 117/200 |
| 2004/0241992 A1* | 12/2004 | Kono | ........................ | C30B 25/12 438/689 |
| 2008/0032040 A1 | 2/2008 | Okabe et al. | | |
| 2014/0261159 A1 | 9/2014 | Okabe et al. | | |
| 2016/0230799 A1* | 8/2016 | Pritchard | ............... | B25B 15/005 |

FOREIGN PATENT DOCUMENTS

| | | |
|---|---|---|
| JP | 2003-203867 A | 7/2003 |
| JP | 2007326761 A | 12/2007 |

OTHER PUBLICATIONS

Extended Search Report issued by the European Patent Office in corresponding European Patent Application No. 19178712.6-1103 dated Dec. 10, 2019 (5 pages).

\* cited by examiner

*Primary Examiner* — Robert M Kunemund

(74) *Attorney, Agent, or Firm* — Buchanan, Ingersoll & Rooney PC

(57) ABSTRACT

A method for manufacturing an epitaxial silicon wafer enables to lower carbon concentration in an epitaxial film. The method forming an epitaxial silicon wafer where an epitaxial film is formed on a silicon wafer in a reaction chamber including a wafer-holding susceptor that separates an upper and lower space communicating through a predetermined gap includes steps of forming a flow of a processing gas flowing laterally along an upper surface of the wafer in the upper space and a flow of a main purging gas flowing towards the susceptor upwardly in the lower space being formed simultaneously, setting a flow rate ratio of the main purging gas flow rate to the processing gas flow rate to be 1.0/100 to 1.5/100 where the processing gas flow rate is set as 100, and controlling a pressure in the upper space to be within an atmospheric pressure ±0.2 kPa at least.

4 Claims, 4 Drawing Sheets

Fig. 4

| | Conditions | | | | Grades | | |
|---|---|---|---|---|---|---|---|
| | Ratio of purging gas flowrate on susceptor back side to processing gas flowrate on susceptor front side (100X) | Pressure in the chamber (kPa) | Susceptor height against the pre-heating ring height (mm) | Ratio of flow rate of total purging gas (slit-purging gas and susceptor drive purging gas) on the susceptor back side to processing gas flowrate on the susceptor front side (100X) | Metal contamination in the chamber | Swirling up of purging gas containing carbon component | Process gas turbulence |
| Comparative Example 1 | 0.5 | 0.1 | -1 | 10.0 | Poor | Good | Good |
| Comparative Example 2 | 0.8 | 0.1 | -1 | 10.0 | Fair | Good | Good |
| Embodiment 1 | 1.0 | 0.1 | -1 | 10.0 | Good | Good | Good |
| Embodiment 2 | 1.3 | 0.0 | -1 | 10.0 | Good | Good | Good |
| Embodiment 3 | 1.5 | 0.0 | -1 | 10.0 | Good | Good | Good |
| Comparative Example 3 | 1.7 | 0.0 | -1 | 10.0 | Good | Poor | Good |
| Comparative Example 4 | 2.0 | 0.1 | -1 | 10.0 | Good | Poor | Good |
| Comparative Example 5 | 1.2 | -0.5 | -1 | 10.0 | Good | Good | Good |
| Comparative Example 6 | 1.2 | -0.3 | -1 | 10.0 | Good | Good | Good |
| Embodiment 4 | 1.2 | -0.2 | -1 | 10.0 | Good | Good | Good |
| Embodiment 5 | 1.2 | 0.2 | -1 | 10.0 | Good | Good | Good |
| Comparative Example 7 | 1.2 | 0.3 | -1 | 10.0 | Good | Poor | Poor |
| Comparative Example 8 | 1.2 | 0.5 | -1 | 10.0 | Good | Poor | Poor |
| Comparative Example 9 | 1.2 | 0.0 | 2 | 10.0 | Good | Good | Poor |
| Comparative Example 10 | 1.2 | 0.0 | 1 | 10.0 | Good | Good | Good |
| Embodiment 6 | 1.2 | 0.0 | 0 | 10.0 | Good | Good | Good |
| Embodiment 7 | 1.2 | 0.0 | -3 | 10.0 | Good | Good | Good |
| Comparative Example 11 | 1.2 | 0.0 | -4 | 10.0 | Good | Good | Poor |
| Comparative Example 12 | 1.2 | 0.0 | -5 | 10.0 | Good | Good | Poor |
| Embodiment 8 | 1.2 | 0.0 | -1 | 1.0 | Good | Good | Good |
| Embodiment 9 | 1.2 | 0.0 | -1 | 5.0 | Good | Good | Good |
| Embodiment 10 | 1.2 | 0.0 | -1 | 15.0 | Good | Good | Good |
| Embodiment 11 | 1.2 | 0.0 | -1 | 18.0 | Good | Good | Good |
| Embodiment 12 | 1.2 | 0.0 | -1 | 20.0 | Good | Good | Good |
| Embodiment 13 | 1.2 | 0.0 | -1 | 20.5 | Good | Good | Good |
| Comparative Example 13 | 1.2 | 0.0 | -1 | 21.0 | Good | Fair | Fair |
| Comparative Example 14 | 1.2 | 0.0 | -1 | 23.0 | Good | Poor | Fair |

METHOD OF MANUFACTURING EPITAXIAL SILICON WAFERS

BACKGROUND OF THE INVENTION

Field of the Invention

The present invention relates to methods of manufacturing epitaxial silicon wafers, particularly to a method of manufacturing an epitaxial wafer allowing reduction of carbon concentration (measurement intensity) in a grown epitaxial film.

Description of the Related Art

For devices based on an insulated gate bipolar transistor (IGBT), utilizing both electrons and holes as carriers, for example, highly required is lowering concentration of carbon in epitaxial films. Namely, suppression of intake of carbon component into epitaxial films is one of the most crucial requirements in epitaxial silicon wafer manufacturing.

One of the reasons for the high concentration of carbon in the epitaxial film can be attributed to a fact that carbon component contained in the processing gas contacting with members in a chamber is taken into the epitaxial film during growing.

Another reason is thought that purging gas flowing under the susceptor holding a silicon wafer contains carbon component by contacting with the members of the chamber and swirls up above the susceptor, and thereby the carbon may be taken into the film component on the wafer.

That is to say, control of the gas in the chamber gives large influences upon the carbon concentration in the epitaxial film.

An attempt to control the gas flow while film forming is a gas-phase growing method disclosed in JP-A-2007-326761. In the gas-phase growing method disclosed in JP-A-2007-326761, when an epitaxial film is grown on a wafer mounted on a susceptor in a reaction chamber 200 having a gas inlet 201 and a gas outlet 202 for a processing gas, as shown in FIG. 6, a processing gas is supplied along a front side of the susceptor 205 and at the same time a purging gas is introduced along a rotation axis 206 supporting the susceptor 205.

The processing gas passing along the front side of the susceptor is exhausted through the gas outlet 202 on the front side of the susceptor and the purging gas is exhausted from a purging gas outlet 207 provided on a back surface of the susceptor; this enable to make no pressure difference between the front side and the back side of the susceptor.

A narrow gap 208 for communicating an upper and lower space separated by the susceptor 205 is formed on an outer periphery of the susceptor 205; this structure reduces the pressure difference and this causes to restrict a gas flow due to the pressure difference, and the gas flow hardly occurs. Consequently, contamination in a growing epitaxial film due to flowing of the purging gas into the upper space is prohibited.

With this configuration that a space in the chamber is separated by the susceptor 205 into the upper space and the lower space, the gas flow in the chamber is easily controllable and the carbon concentration in the epitaxial film grown on a wafer W also becomes controllable.

The gas-phase grown method disclosed in JP-A-2007-326761, however, fails to consider balancing of the gases flowing above the susceptor and below the susceptor.

When a flow rate ratio of the purging gas to processing gas is larger than a predetermined value, a purging gas flow into the upper space through the narrow gap 208 increases and this may cause an atmospheric gas containing carbon component to swirl up. As a result, there arises a problem of increasing carbon concentration in the epitaxial film formed on the wafer W.

SUMMARY OF THE INVENTION

The present invention has been made in view of the above problem and it is an object to provide a method of manufacturing epitaxial silicon wafers, which method enables to reduce carbon concentration in an epitaxial film when the epitaxial film on a silicon wafer is formed.

The method of manufacturing epitaxial silicon wafers according to the present invention to achieve the above object is that an epitaxial film is formed on a surface of a silicon wafer in a reaction chamber having a wafer-holding susceptor that separates an upper and lower space communicating through a predetermined gap, in which chamber a flow of a processing gas laterally along an upper surface of the wafer is formed in the upper space and a flow of a main purging gas flowing towards the susceptor upwardly in the lower space is formed simultaneously, and a flow rate ratio of the main purging gas flow rate to the processing gas flow rate is set to be 1.0/100 to 1.5/100 when the processing gas flow rate is set as 100, and a pressure in the upper space is at least controlled to be within an atmospheric pressure ±0.2 kPa.

The gap is formed between an inner periphery of an annular preheating ring disposed along the outer periphery of the susceptor and the outer periphery of the susceptor, and a position in height of the susceptor is desirably set to be within −3 mm to +0 mm relative to a position in height of the preheating ring.

A slit purging gas flow is formed from a slit that functions as a transfer gate of silicon wafers for the reaction chamber, flowing in the lower space, and when the processing gas flow rate is set as a base of 100, a flow rate ratio of the flow rate of the main purging gas flowing in the lower space to the slit purging gas flow rate is desirably set to be equal to or less than 20.5/100.

By controlling the flow rate ratio of the flow rate of the purging gas flowing in the lower space of the reaction chamber to the flow rate of the processing gas flowing in the upper space thereof, this configuration enables to suppress swirling up of an atmospheric gas containing carbon component and to reduce carbon concentration in the epitaxial films.

BRIEF DESCRIPTION OF THE DRAWINGS

FIG. 4 is a table showing results of embodiments and comparative examples;

DESCRIPTION OF THE PREFERRED EMBODIMENTS

Figure 1:
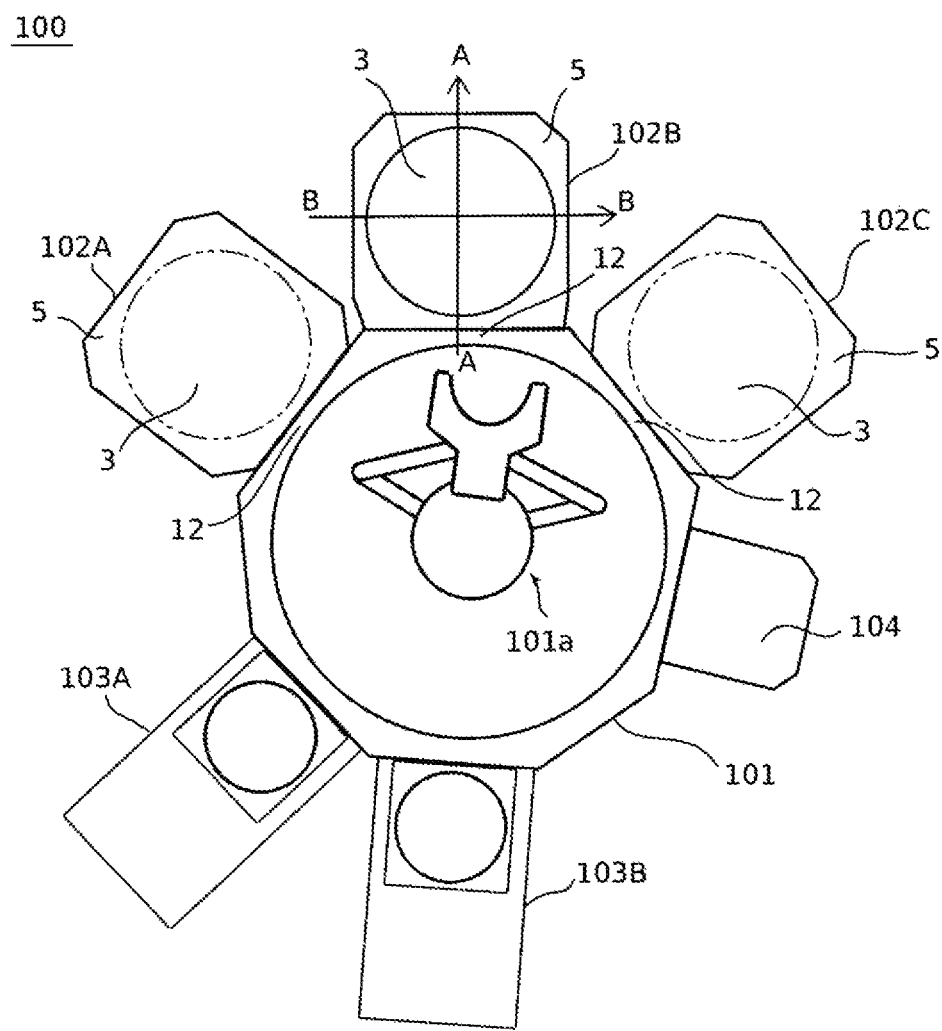
FIG. 1 is a plain view of a chemical vapor deposition (CVD) apparatus to which a method of manufacturing epitaxial silicon wafers according to the present invention is applicable.

Embodiments of a method of manufacturing epitaxial silicon wafers according to the present invention will be explained below with reference to the drawings. FIG. 1 is a plain view of a chemical vapor deposition (CVD) apparatus to which the method of manufacturing epitaxial silicon wafers according to the present invention is applicable.

Figure 2:
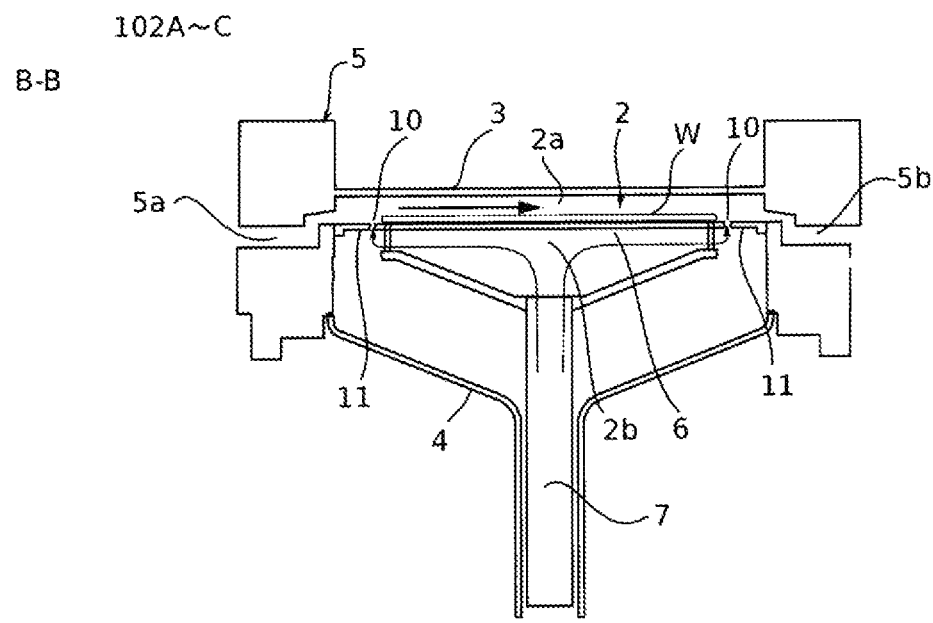
FIG. 2 is a cross sectional view of one of the process chamber illustrated viewed along arrows B-B in FIG. 1.
Figure 3:
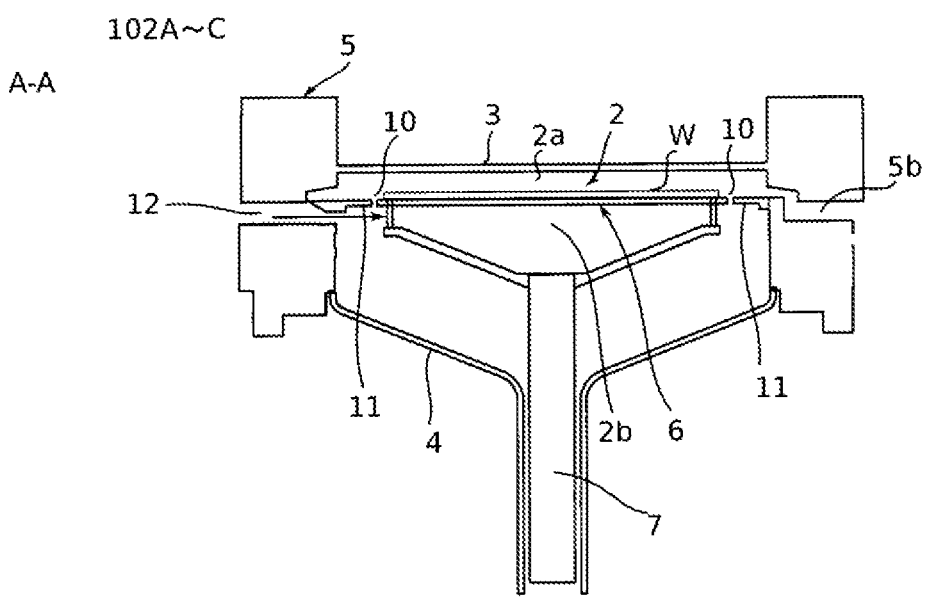
FIG. 3 is a cross sectional view of one of the process chamber illustrated viewed along arrows A-A in FIG. 1.

FIG. 2 is a cross sectional view of the process chamber illustrated viewed along arrows B-B in FIG. 1 and FIG. 3 is a cross sectional view of the process chamber illustrated viewed along arrows A-A in FIG. 1.

As shown in FIG. 1, a CVD apparatus 100 is provided with a buffer chamber 101 which temporally keep a plurality of wafers and a process chambers 102A to 102C disposed along an outer periphery of the buffer chamber 101.

The CVD apparatus 101 further includes two load lock chambers 103A and 103B disposed along the outer periphery of the buffer chamber 101 and one cooling chamber 104.

The buffer chamber 101 includes a transfer robot 101a at the inside. The transfer robot 101a conveys a wafer W between load lock chambers 103A and 103B and process chambers 102A through 102C.

The load lock chambers 103A or 103B is provided in order to separate a cleanroom atmosphere and atmospheres in the load lock chambers 103A or 103B and beyond.

When wafers W are brought from a wafer transfer container (not shown) in a cleanroom into the load lock chamber 103A or 103B, the chamber is depressurized once and then purged with $N_2$ gas. After the chamber has become atmospheric pressure, the wafers W are to be transferred by a transfer robot 101a to any one of processing chambers 102A to 102C.

The cooling chamber 104 is used to cool the wafers W while transferring.

As shown in FIGS. 2 and 3, each of the processing chambers includes an epitaxial film forming chamber 2 (hereinafter simply referred to as a film forming chamber 2). The film forming chamber 2 is a space formed with a disk-shaped ceiling 3 and a bottom part 4 of an inverted cone shape, the peripheries of which are supported by a supporting frame 5. The ceiling 3 and the bottom part 4 are made of quartz glass, for example, and a silicon wafer substrate W mounted at the inside of the film forming chamber 2 is to be heated by a halogen lamp (not shown) disposed at an upper and lower part of the chamber. A susceptor 6 on which the silicon wafer substrate is to be mounted is disposed in the film forming chamber. The susceptor 6 is supported by a rotating axis 7 from the below so as to rotate with the mounted silicon wafer substrate W.

The space of the film forming chamber 2 is divided by the susceptor 6 approximately by half, thereby forming an upper space 2a and a lower space 2b. An upper surface of the silicon wafer substrate W, mounted on the susceptor 6 as described above, is a principal surface on which an epitaxial film is to be formed.

The supporting frame 5 is provided with a gas inlet 5a to introduce a processing gas above the susceptor, that is, into the upper space 2a, and a gas outlet 5b disposed at the opposite side of the supporting frame 5 to oppose to the gas inlet 5a.

A processing gas is introduced from the gas inlet 5a into the film forming chamber in order to flow laterally along the surface of the silicon wafer substrate W, which processing gas is a silicon source gas (raw material gas) such as dichlorosilane $SiH_2Cl_2$ or trichlorosilane $SiHCl_3$ diluted with hydrogen gas $H_2$ as a carrier gas and added with a very small amount of a dopant. After passing along the silicon wafer surface to form an epitaxial film, the supplied gas is discharged from the gas outlet 5b to the outside of the apparatus.

In addition, an annular preheating ring 11 is provided at the inner periphery of the supporting frame 5 and the susceptor 6 is disposed with a predetermined gap 10 from the inner periphery of the preheating ring; that is, the outer circumference of the susceptor 6 is surrounded by the preheating ring 11. Described in more detail, the periphery of the susceptor is arranged with a height difference of −3 mm to +0 mm from the inner periphery of the preheating ring; this determines the dimension of the gap 10. By making such a height difference between the preheating ring 11 and the susceptor 6, an effect of suppressing flow turbulence of the processing gas can be obtained. In addition, the susceptor 6 can be rotatable owing to the gap 10 and the gap 10 becomes a communicating path that communicates the upper space 2a with the lower space 2b of the susceptor.

In the lower space 2b, hydrogen gas H2 as a purging gas is introduced from a lower portion of the rotating axis 7, flows toward the susceptor upwardly, expands along the bottom part 4 of the inverted cone shape, and partially flows like swirling following the rotation of the rotating axis 7 and the susceptor 6. The purging gas further flows up to the upper space 2a passing through the gap 10 and is discharged to the outside from the gas outlet 5b.

As shown in FIG. 3, a slit 12 is formed at a gate area connecting with the buffer chamber 101, and the purging gas flows through the slit 12 toward the lower space 2b. This is aimed to prevent the slit 12 from being damaged by the processing gas which enters the slit 12.

Next, a method of forming an epitaxial film on a Si wafer W using thus constructed CVD apparatus 100 will be explained following along a series of events.

When a Si wafer substrate W is transferred to the load lock chamber 103, for example, from a wafer transfer container (not shown), the inside of the chamber is once depressurized and purged with $N_2$ gas.

When the load lock chamber restores to the atmospheric pressure, the transfer robot 101a of the buffer chamber 101 receives the wafer W from the load lock chamber 103A and then mount the wafer on the susceptor 6 of the process chamber 102B, for example.

Then a depressurized film forming room is formed in the process chamber 102B. The pressure in the upper area 2a is controlled to be in a range of the atmospheric pressure ±0.2 kPa; this is to suppress a flow turbulence of the processing gas in the chamber that may be a cause of swirling up of the atmospheric gas containing carbon component.

The processing gas is introduced from the gas inlet 5a at a predetermined flow rate, 30 slm to 60 slm, for example, where slm stands for standard litter per minute, and flows parallel to the upper surface of the wafer and then is discharged from the gas outlet 5b.

In the lower space 2b, the purging gas is introduced from a supply port (not shown) placed below the rotating axis 7. The introduced purging gas, called a main purging gas, flows toward the susceptor 6 and spreads along the spreading of the cone-like shape of the bottom part 4. Then the purging gas flows to the upper area 2a through a gap between the preheating ring 11 and the susceptor 6 and discharged from the gas outlet 5b.

In this case, when letting the processing gas flow rate be as a base of 100, a flow rate ratio of the main purging gas flow rate, flowing in the lower area 2b, to the processing gas flow rate is set to be 1.0/100 to 1.5/100. This is because when the ratio of the purging gas to the processing gas is less than 1.0/100 the inside of the chamber is likely to be metal-contaminated and when the ratio exceeds 1.5/100 the atmospheric gas containing carbon component is likely to be swirled up.

A predetermined amount of purging gas, called a slit purging gas, is flown toward the lower space 2b from a slit 12 formed at a connecting gate area of the supporting frame 5 and the buffer chamber 101.

In this case, when letting the processing gas flow rate, flowing in the upper space 2a, be as a base of 100, a ratio of an added flow rate of the slit purging gas and the main purging gas to the processing gas flow rate is set to be equal to or less than 20.5/100. This enables to achieve a pressure balance between upper and lower boundary region of the susceptor to make pressure of the upper space 2a larger than the pressure of the lower space 2b and to suppress swirling up of the atmospheric gas containing carbon into the upper space 2a.

Thus achieving a flow control of gases enables to form an epitaxial film controlled to have a low carbon concentration on the surface of the wafers W.

As described in an embodiment according to the present invention, in a CVD apparatus where the inside of the chamber is almost separated by the susceptor on which a Si wafer is to be mounted into an upper and a lower spaces, controlling of the ratio of the purging gas, flowing in the lower space 2b, to the processing gas, flowing in the upper space 2a, enables to suppress swirling up of the atmospheric gas containing carbon component and to decrease the carbon concentration in the epitaxial film.

The manufacturing method of epitaxial Si wafers according to the present invention will be explained on a basis of the example. In the example, the following experiments were performed based on the embodiment.

Experiment 1

In Experiment 1, three evaluation items, specifically metal contamination in the chamber, swirling up of an atmospheric gas containing carbon component, and turbulence of the processing gas, were evaluated by experiments, in order to define preferable ranges of the following issues, using a CVD apparatus the configuration of which is shown in FIGS. 1 through 3:
1. Ratio of the flow rate of the main purging gas in a lower space to the flow rate, set as 100, of the processing gas in the upper space,
2. Pressure in the chamber,
3. Susceptor height with respect to the height of the preheat ring, and
4. Ratio of the flow rate of the main purging gas and the slit purge gas in the lower space to the flow rate, set as 100, of the processing gas in the upper space.

Specific evaluation items are following three points: metal contamination in the chamber, swirling up of carbon containing atmosphere and turbulence of the processing gas.

Table of FIG. 3 shows conditions and results of embodiments 1 through 13 and comparative examples 1 through 14. Regarding metal contamination in the chamber, a life time value of wafers after processing is measured: when the value stably meets the criterion standard, graded Good; when mostly meets but sometimes fails, graded Fair; and always fails to meet, graded Poor. Regarding swirling up of carbon containing atmosphere, carbon intensity of carbon on the wafers after processing: when the value stably meets the criterion standard, graded Good; when mostly meets but sometimes fails, graded Fair; and always fails to meet, graded Poor. Regarding turbulence of the processing gas, variation in thickness of the films on the wafers after processing is measured: when the value stably meets the criterion standard, graded Good; when mostly meets but sometimes fails, graded Fair; and always fails to meet, graded Poor.

As shown in FIG. 4 followings are confirmed:
1. It is preferable that the ratio of the flow rate of the main purging gas in a lower space to the flow rate, set as 100, of the processing gas in the upper space is in a range of 1.0/100 to 1.5/100.
2. It is preferable that the pressure in the chamber or pressure in the chamber (furnace pressure) is in a range of the atmospheric pressure ±0.2 kPa.
3. It is preferable that the susceptor height with respect to the height of the preheat ring is in a range of −3 mm to 0 mm.
4. It is preferable that the ratio of the flow rate of the main purging gas and the slit purge gas in the lower space to the flow rate of the processing gas, set as 100, in the upper space is in a range of 1.0/100 to 20.5/100.

Experiment 2

In Experiment 2, under the favorable condition defined by the results of Experiment 1, carbon concentration contained in the epitaxial films against the flow rate of purging gas in the lower space of the chamber is evaluated using photoluminescence (PL) measurement method.

In Embodiment 14, the ratio of the flow rate of the main purging gas in a lower space to the flow rate, set as 100, of the processing gas in the upper space was set to be 1.25/100 with a flow rate of 0.5 slm. The pressure in the chamber was set to be in a range of the atmospheric pressure ±0.2 kPa and the susceptor height with respect to the height of the preheat ring was set to be in a range of −3 mm to 0 mm. Under the above-stated condition, epitaxial films were formed on wafers and carbon intensity was measured with the PL measurement method.

In Comparative example 15, the ratio of the flow rate of the main purging gas in a lower space to the flow rate, set as 100, of the processing gas in the upper space was set to be 2.5/100 with a flow rate of 1.0 slm. Other conditions were same as that of Embodiment 14, and carbon intensity was similarly measured with the PL measurement method.

Figure 5:
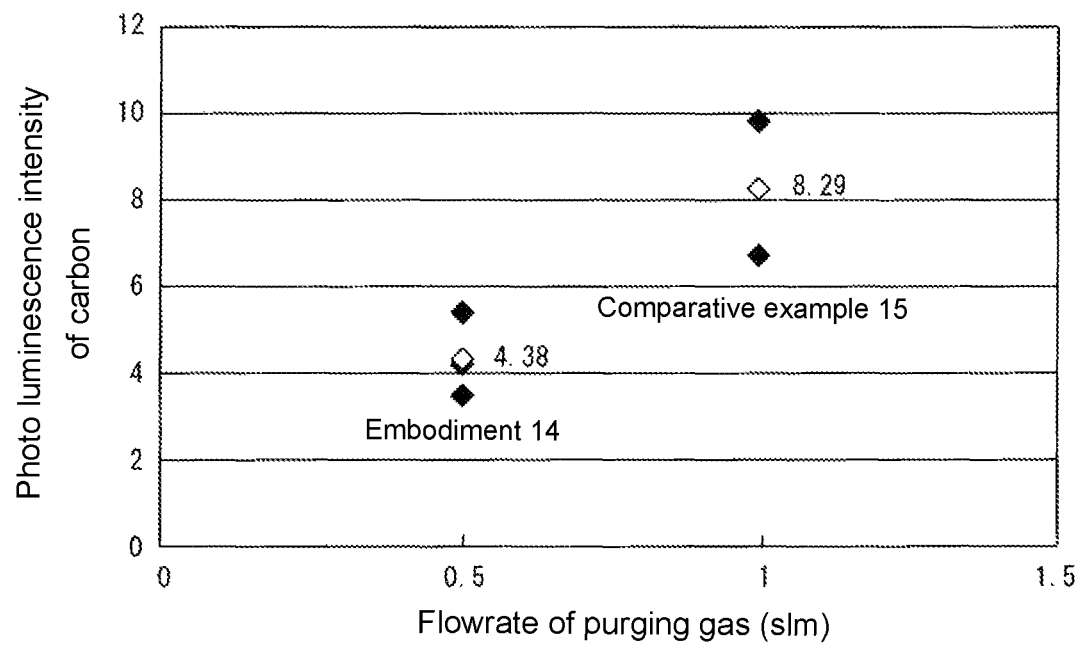
FIG. 5 is a graph showing results of other embodiments and corresponding comparative examples.
Figure 6:
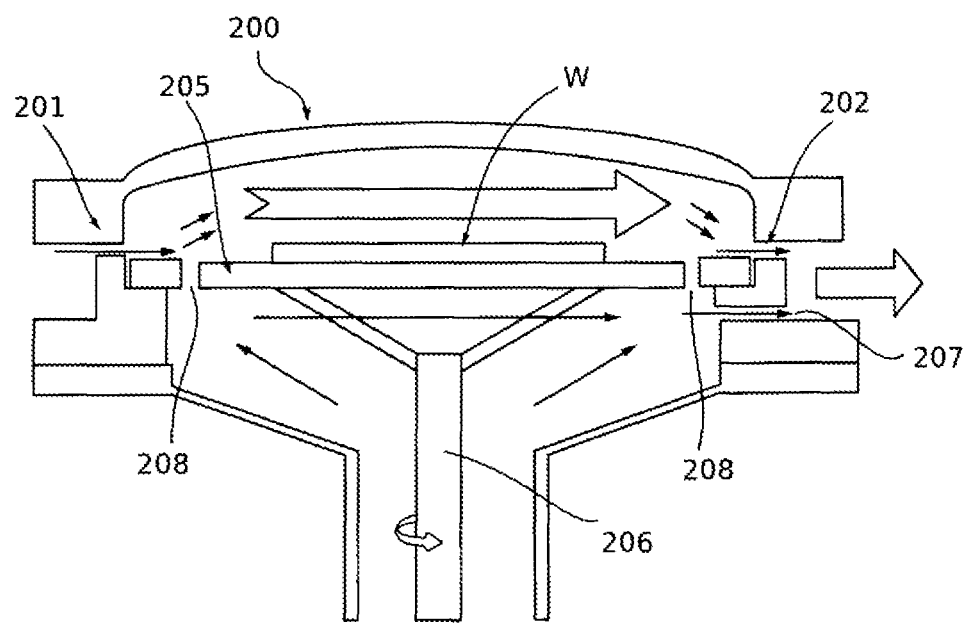
FIG. 6 is across sectional view showing a process chamber to which a conventional chemical vapor deposition method is applied.

Both results of Embodiment 14 and Comparative example 15 are shown in a graph of FIG. 5, where the horizontal axis denotes flow rate of the main purging gas in units of slm, and the vertical axis denotes carbon intensity. As shown in FIG. 5, the carbon intensity of the epitaxial film was 4.38 for Embodiment 14, and 8.29 for Comparative example; this means the carbon intensity is halved in Embodiment 14 compared to in Comparative example 15.

From the results above, it is confirmed that the present invention enables to reduce carbon concentration in epitaxial films formed on wafers is reduced in comparison with the conventional method.

What is claimed is:

1. A method of manufacturing an epitaxial silicon wafer comprising a silicon wafer and an epitaxial film formed on a surface of the silicon wafer in a reaction chamber provided with a wafer-holding susceptor separating an upper and lower space communicating through a predetermined gap, the method comprising:

forming a flow of a processing gas laterally along an upper surface of the wafer in the upper space and a flow of a main purging gas flowing towards the susceptor upwardly in the lower space is formed simultaneously;

setting a flow rate ratio of the main purging gas flow rate to the processing gas flow rate to be 1.0/100 to 1.5/100, when the processing gas flow rate is set as 100; and controlling a pressure in the upper space to be within an atmospheric pressure ±0.2 kPa.

2. The method of manufacturing epitaxial silicon wafer according to claim 1, further comprising: an annular preheating ring disposed along an outer periphery of the susceptor, wherein a gap is formed between an inner periphery of the preheating ring and an outer periphery of the susceptor and a position in height of the susceptor is set to be within −3 mm to +0 mm relative to a position in height of the preheating ring.

3. The method of manufacturing epitaxial silicon wafer according to claim 1, wherein a slit purging gas flow is formed in the lower space from a slit functioning as a transfer gate of silicon wafers of the reaction chamber, and a ratio of the flow rate of the main purging gas and the slit purging gas flowing in the lower space to the flow rate of the processing gas, set as 100, flowing in the upper space is set to be equal to or less than 20.5/100.

4. The method of manufacturing epitaxial silicon wafer according to claim 2, wherein a slit purging gas flow is formed in the lower space from a slit functioning as a transfer gate of silicon wafers of the reaction chamber, and a ratio of the flow rate of the main purging gas and the slit purging gas flowing in the lower space to the flow rate of the processing gas, set as 100, flowing in the upper space is set to be equal to or less than 20.5/100.

* * * * *